United States Patent
Santin et al.

(12)

(10) Patent No.: US 6,768,295 B2
(45) Date of Patent: Jul. 27, 2004

(54) OFFSET CALIBRATION OF CURRENT SHARING SIGNAL FOR POWER SUPPLY UNITS IN REDUNDANT OPERATION

(75) Inventors: Jose A. Santin, Cypress, TX (US); Masud Reza, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 127 days.

(21) Appl. No.: 10/158,336

(22) Filed: May 30, 2002

(65) Prior Publication Data

US 2003/0222634 A1 Dec. 4, 2003

(51) Int. Cl.$^7$ .......................... G01R 29/00; H02J 1/10
(52) U.S. Cl. ..................... 324/76.79; 307/52
(58) Field of Search .................... 323/234, 272; 363/72, 65; 324/76.79, 601, 613; 307/52, 31, 32

(56) References Cited

U.S. PATENT DOCUMENTS

2001/0033502 A1 * 10/2001 Blair et al. .................. 363/65

* cited by examiner

*Primary Examiner*—N. Le
*Assistant Examiner*—Amy He

(57) ABSTRACT

The specification discloses a system and related method for ensuring that power supply units operated in a parallel fashion evenly distribute the load among them. More particularly, the specification discloses a system and related method for correcting current sharing signals produced by each power supply unit for offsets induced by imperfections in the electronic circuitry that produces the current sharing signals.

31 Claims, 4 Drawing Sheets

OFFSET CALIBRATION OF CURRENT SHARING SIGNAL FOR POWER SUPPLY UNITS IN REDUNDANT OPERATION

CROSS-REFERENCE TO RELATED APPLICATIONS

None.

STATEMENT REGARDING FEDERALLY SPONSORED RESEARCH OR DEVELOPMENT

Not applicable.

BACKGROUND OF THE INVENTION

1. Field of the Invention

The preferred embodiments of the present invention are directed generally to systems having multiple power supply units, with each power supply unit responsible for supplying some portion of the electrical current to the load. More particularly, the preferred embodiments are directed to increasing the accuracy of the current sharing signal that extends between the power supply units to ensure that each power supply unit carries a proportionate amount of the load.

2. Background of the Invention

It is common in the design of electronic systems, especially systems that need redundancy, to provide multiple power supply units. In normal operation, the load is split between two or more power supply units; however, in the event that one power supply unit fails, the remaining power supply unit (or units) provides the additional power to keep the system operational. FIG. 1 shows, in block diagram form, a related art system having two power supply units 10 and 12 supplying power to an exemplary load 14. In particular, FIG. 1 shows that each of the power supply units 10, 12 has a power supply 16 and 18 respectively. This power supply converts the incoming power, which may be an alternating current (AC) or direct current (DC) signal, into an appropriate, typically DC, source for use by the load 14. Each power supply unit has a diode 20, 22 to prevent electrical current from one power supply unit from flowing in reverse fashion into a second power supply unit.

In order to balance the load carried between multiple power supply units in a system, it is necessary to measure the output current of each individual power supply unit 10, 12. In the related art, this is done by a low value series resistor 24, 26 in series with the output of the power supply unit 10, 12. Current flowing through the series resistor 24, 26 develops a differential voltage, which is indicative of the overall power supplied by each power supply unit 10, 12. The differential voltage is fed to a load control unit 28, 30, which converts the differential voltage into a current sharing signal that is coupled to other power supply units by way of the load control line 32. Each power supply unit 10, 12 monitors the current sharing signal on the load control line 32, and adjusts its output voltage (and therefore its output current) in an attempt to level the load between the various power supplies.

FIG. 2 shows a related art load control unit. In particular, the differential voltage from the series resistor feeds an amplifier 34, which takes the differential signal and creates a voltage proportional to the differential voltage. The Intelligent Platform Management Interface (IPMI) standard, a specification created by a conglomerate of computer manufacturers, requires that the current sharing signal range from zero to eight volts as the power supply unit power output ranges from zero to full load. The output of the amplifier 34 feeds through an isolation amplifier 36 to the load control line 32. Consider, for purposes of explanation, that another power supply unit is supplying more of the total required power than the power supply unit in which the load control circuit of FIG. 2 resides. In this case, the voltage at the output of the amplifier 34 is lower than the voltage on the voltage control line 32. The difference is sensed by the combination of isolation amplifier 38 and circuit 40, and is fed to a power supply voltage control unit (not shown).

Because of electrical noise, resistive shot-noise, imperfections in amplifier manufacturing, and the like, the internal current sharing signal 42 may not accurately reflect the load carried by the power supply unit, especially DC offsets in the signal not attributable to current flow. There are two related art approaches to addressing, though not solving, this problem. The first is to adjust the gain of the load control unit such that at fall load the current sharing signal 42 accurately reflects the output power. This, however, may create substantial errors at the low supplied-power end, e.g. at the 50% load, where power supply units operate in a two-power supply unit configuration. The second approach is to adjust the internal current sharing signal 42 to accurately match actual supplied power at the mid-range (or some other relevant loading), but this method too induces error both at the higher and lower ends of the supplied power spectrum. The IPMI specification allows for as much as a 10% difference in load carried among parallel supply units.

Thus, what is needed in the art is a system and related method for accurately detecting and generating the current sharing signal for more precise load sharing in multiple power supply situations.

BRIEF DESCRIPTION OF SOME OF THE PREFERRED EMBODIMENTS

The problems noted above are solved in large part by a system and related method that compensates for the errors in creation of the current sharing signal. More particular, the preferred embodiments are directed to a circuit which reads the differential signal created by the series resistor, and creates a current sharing signal, which is adjustable not only with respect to its gain, but also with respect to its offset. In a second aspect, the preferred embodiments are directed to a method of calibrating the load control circuits of power supply units with a computer that involves first setting the gain of the load control circuit, followed by setting the offset of the load control circuit.

The disclosed devices and methods comprise a combination of features and advantages which enable it to overcome the deficiencies of the prior art devices. The various characteristics described above, as well as other features, will be readily apparent to those skilled in the art upon reading the following detailed description, and by referring to the accompanying drawings.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer and electronics companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
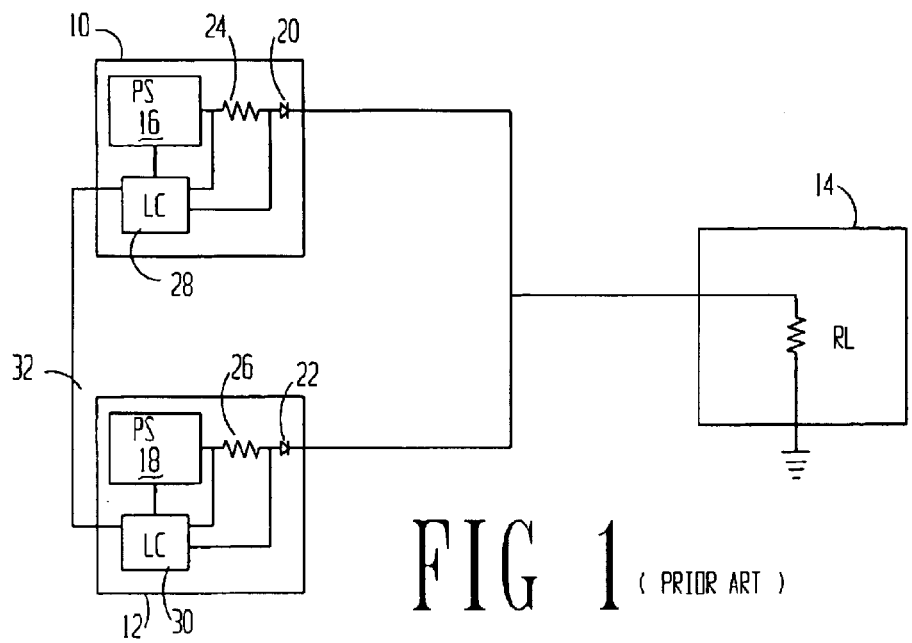
FIG. 1 shows a related art system having two power supply units supplying a single load.
Figure 2:
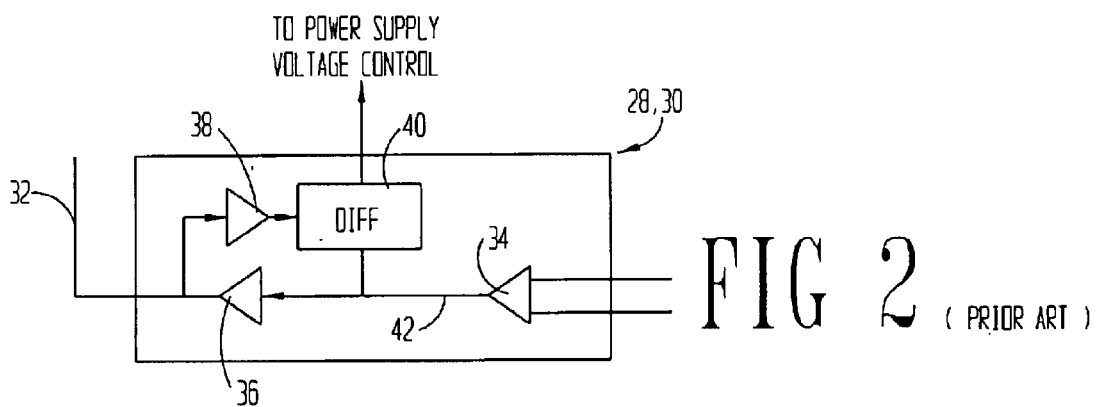
FIG. 2 shows a related art load control circuit.
Figure 3:
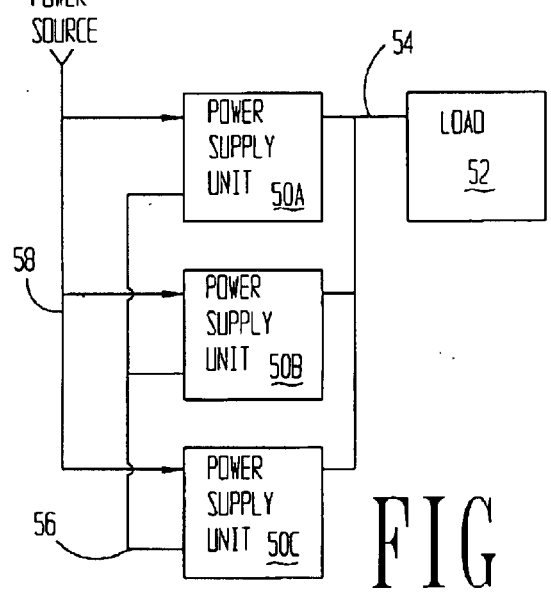
FIG. 3 shows an embodiment of a system having three power supply units.

FIG. 3 shows an embodiment having multiple power supply units feeding one or more power consuming devices, collectively referred to as load 52. In particular, FIG. 3 shows three power supply units 50A–C, each feeding the load 52. While FIG. 3 shows three such power supply units 50, any number of power supply units are within the contemplation of this invention. In the preferred embodiments, each of the power supply units 50 supplies direct current (DC) power at its output, and thus the load 52 utilizes DC power for its operation. FIG. 3 further shows that each of the power supply units 50 couples to a power source. The power source could be either a DC source, meaning that the power supply units 50 would each contain a DC—DC switching power supply, or the power source may be an alternating current (AC) signal, meaning that the power supply units 50 each contain a AC-DC power supply. The preferred embodiments of the present invention may be used regardless of the type of input power source, and thus all such sources, and combinations, fall within the contemplation of this invention.

Situations where multiple power supply units 50 supply a load 52, such as that shown in FIG. 3, typically implement the redundancy because of the importance of the load 52. That is, the load 52 may be a critical system such as an on-line retail server, a radar system for air traffic control, a control system for operation of a large industrial plant, or the like, and thus may need to be able to withstand the failure of any particular power supply unit. Further, the various power supply units 50 of the system may be coupled to different sources, thus protecting the load 52 from the loss of any individual source. Regardless of the precise reasons or the individual setup, in normal operation it is desired that the total power supplied to the load 52 be evenly divided among the various power supply units 50. As discussed in the Background section, related art systems adhering to the IPMI standard could only assure load balancing within approximately 10%. However, as the number of power supply units increase, or the total load decreases, a 10% load difference between power supply units may be significant. The preferred embodiments of the present invention decrease the amount of differential between the power supply units, and thus increase the load distribution among the various power supply units 50. Using the embodiments described below, distribution errors as low as 2% or less are achieved.

Figure 4:
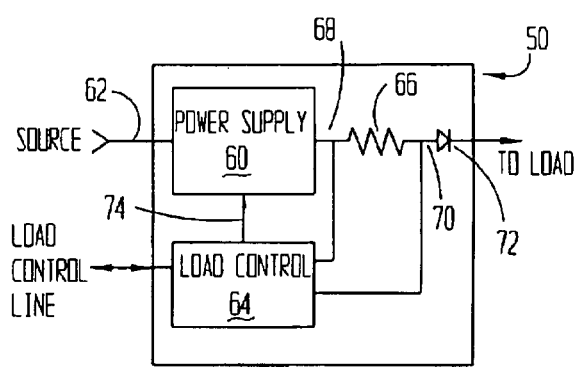
FIG. 4 shows, in block diagram form, a power supply unit of the preferred embodiments.

FIG. 4 shows, in block diagram form, a more detailed power supply unit 50 of the preferred embodiment. In particular, each power supply unit 50 preferably comprises a power supply 60, which converts the source power 62 into DC power which is fed to the load 52. The power supply unit 50 also comprises a load control unit 64 which couples to a resistor 66. The resistor 66 is placed in series with current supplied to the load 52, and the resistor 66 preferably has a very small value, on the order of 0.01 ohm or less. As shown in the exemplary drawing of FIG. 4, the load control circuit 64 couples to both the upstream 68 and downstream 70 side of the resistor 66. In this way, the load control of circuit 64 is able to read a differential voltage developed across the resistor 66, which is proportional to the current flow from the individual power supply unit 50. The power supply unit 50 also comprises a diode 72 which ensures that direct current amperage only flows out of each individual power supply unit. The power supply 60 within the power supply unit 50 preferably has the capability of supplying current as required by the particular load, but also adjusting its output voltage so that the amount of power supplied to the load 52 may be controlled. The power supply 60 preferably makes this adjustment based on a voltage adjust signal 74 coupled between the load control unit 64 and the power supply 60.

Figure 5:
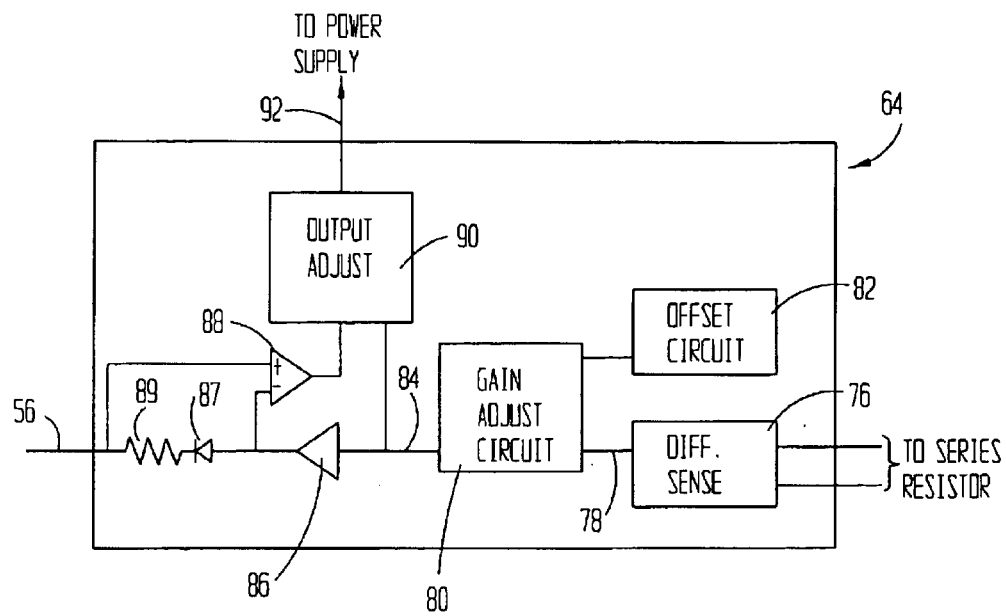
FIG. 5 shows, in greater detail than FIG. 4, the load control circuit 64 of the preferred embodiment.

FIG. 5 shows a more detailed block diagram of the load control circuit 64 of the preferred embodiments. In particular, the differential voltage created by current flow across the resistor 66 is sensed by the differential sense circuit 76. The differential sense circuit 76 has an output 78 that feeds the gain adjust circuit 80. The offset circuit 82 of the preferred embodiments produces a signal which is effectively summed with the output of a differential sense circuit 76 in the gain adjust circuit 80. Thus, the gain adjust circuit 80 performs at least two functions: 1) sums the signal created by the offset circuit 82 with the signal created by the differential sense circuit 76; and 2) provides an adjustable gain. Finally, the internal current sharing signal 84, which represents the current, and therefore the power, produced by the particular power supply unit 50, is applied to a unity gain amplifier 86, which simply acts to isolate the load control circuit 64 from the load control line 56. As was discussed with respect to FIG. 3, the voltage on load control line 56 couples to each of the power supply units 50A–C, and it is by monitoring this line that each power supply unit adjusts its output voltage (and therefore power) to evenly distribute the load.

Amplifier 88, a unity gain amplifier, couples to and monitors the load control line 56, and applies the signal to the output adjust circuit 90. More particularly, the internal current sharing signal 84 couples (though amplifier 86, diode 87 and resistor 89) to the load control 56. Amplifier 88 preferably has its inverting input coupled to the output signal of amplifier 86, and has its non-inverting input coupled downstream of the diode 87 and resistor 89. The signal created by amplifier 88 is thus proportional to the difference between the internal current sharing signal 84 and the voltage on the load control line 56. The output adjust circuit 90 couples to and observes the output signal of the amplifier 88 to determine if the power supply unit at issue is supplying more or less of the overall power than other power supply units. If the power supply unit under consideration is supplying more power (and therefore diode 87 is forward biased), the output adjust circuit 90 commands the power supply 60 to decrease voltage by applying an appropriate signal across line 92. Likewise, if the power supply unit 50 under consideration is supplying less power than remaining units (and therefore diode 87 is reversed biased), then the output adjust circuit 90 commands the power supply 60 to increase voltage.

Figure 6:
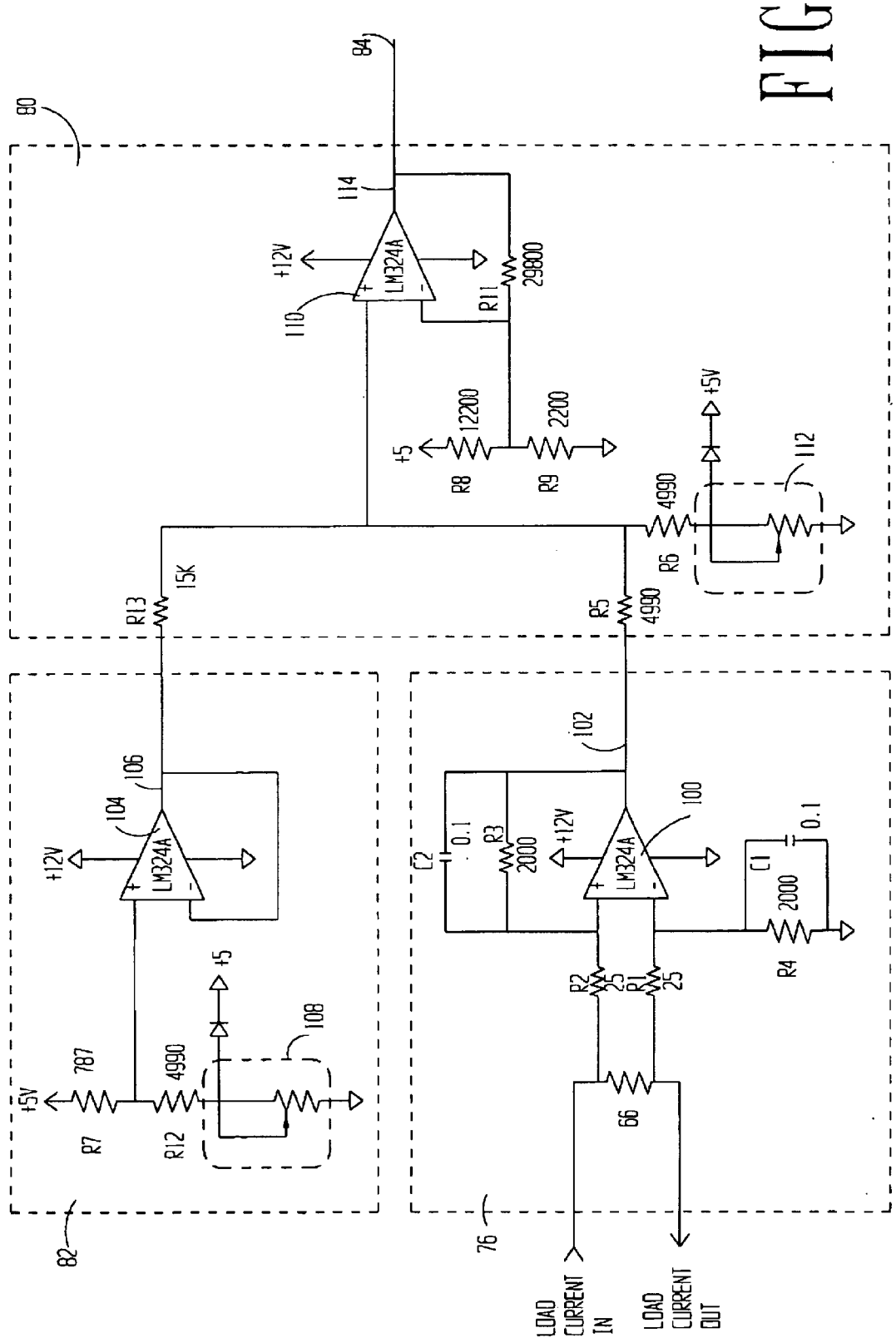
FIG. 6 shows an electrical schematic of various components of the load control circuit 64 of the preferred embodiment.

FIG. 6 shows a more detailed electrical diagram of the differential sense circuit 76, offset circuit 82 and the gain adjust circuit 80. The heart of each of these circuits is an operational amplifier (op-amp), preferably an LM324A; however, any suitable amplifier system may be used. The current through the resistor 66 creates a differential voltage which is sensed by the op-amp 100. In the preferred configuration shown for the differential sense circuit 76, the op-amp 100 and related circuitry provide most of the amplification of the differential voltage required of the load control circuit 64. Thus, the output 102 of the op-amp 100 is proportional to the voltage developed across the resistor 66 multiplied by the gain. The various resistances shown within the differential sense circuit 76, as well as all the resistances shown in FIG. 6, are given in ohms. Likewise, the capacitances shown in FIG. 6 are all given in microfarads. If the power supply unit 50 within which the differential sense circuit 76 resides is producing a full load of 50 amps of current (thus 50 amps are flowing through the resistor 66), then the output 102 of the op-amp 100 in the configuration shown is approximately 8.0 volts plus an offset voltage.

Still referring to FIG. 6, the preferred embodiment of the offset circuit 82 is shown. Op-amp 104, in combination with the remaining circuit elements, is configured to be a voltage follower. In other words, the voltage present at the non-inverting input of the op-amp 104 is the same as the output voltage driven to line 106. The offset circuit 82 is designed to produce a variable voltage, which is adjustable by way of the resistor 108. While a standard potentiometer may be suitable for this application, the preferred embodiments use a Maxim DS1846 digitally controlled potentiometer made by Dallas Semiconductor. In this way, adjustments to power supply units 50 may be done by computer in an automated system, discussed more fully below. By adjusting the digitally controlled potentiometer 108, the offset circuit 82 is capable of producing a voltage at its output 106.

The output signal of the differential sense circuit 76 (the power sense signal), and the output signal of the offset circuit 104 are each applied to the gain adjust circuit 80. The gain adjust circuit 80 provides an adjustable gain for the sensed current flow from the power supply in which the gain adjust circuit 80 resides, and also sums the output signal 106 from the offset circuit 82. Much like the digitally controlled resistor 108, the adjustable resistance 112 is likewise a Maxim DS1846 digitally controlled potentiometer. The output 114 of the op-amp 110 becomes the offset adjusted current sharing signal (or alternatively load control signal) supplied by the power supply unit in which the gain circuit 80 resides. The remaining elements of each of the differential sense circuit 76, offset circuit 82 and gain circuit 80 are familiar to one of ordinary skill in the art, and for brevity of this discussion will not be discussed in great detail. For completeness, the diodes in each of the gain control circuit 80 and offset circuit 82 have a part number BAS16T. Implementing the diodes in each of these circuits in this manner is for over-voltage protection for the digitally controlled resistances 108 and 112.

Figure 7:
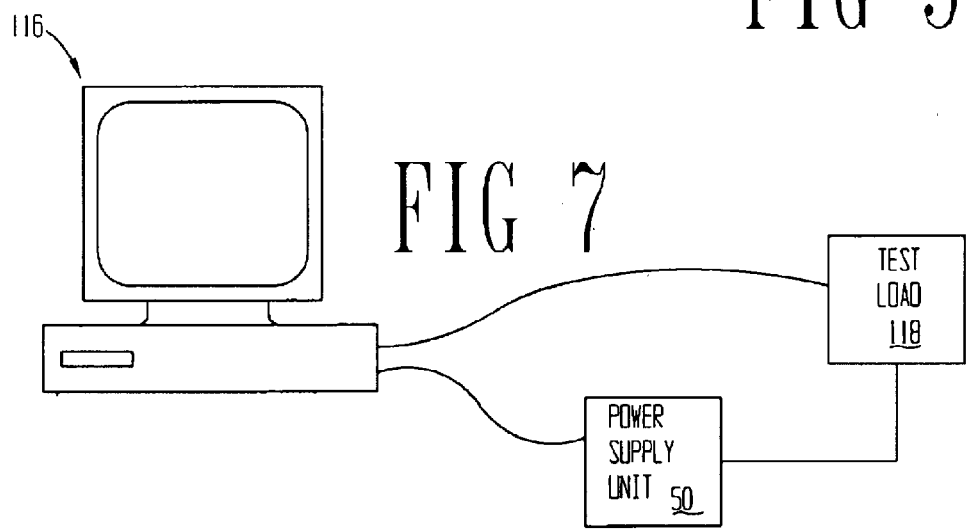
FIG. 7 shows a system for automatically adjusting the gain and offset of a power supply unit of the preferred embodiment.

FIG. 7 shows an exemplary system used to calibrate the power supply unit 50 of the preferred embodiment. In particular, FIG. 7 shows a computer system 116 coupled to the power supply unit 50 and a test load 118. Preferably the computer system 116 couples to the power supply unit 50 in such a way as to be in communication with the digitally controlled resistances 108 and 112. Further, the computer 116 communicates to the test load 118. This communication is required so that the electrical current required of the power supply unit 50 may be varied so that the load control circuit 64 may be adjusted.

Figure 8:
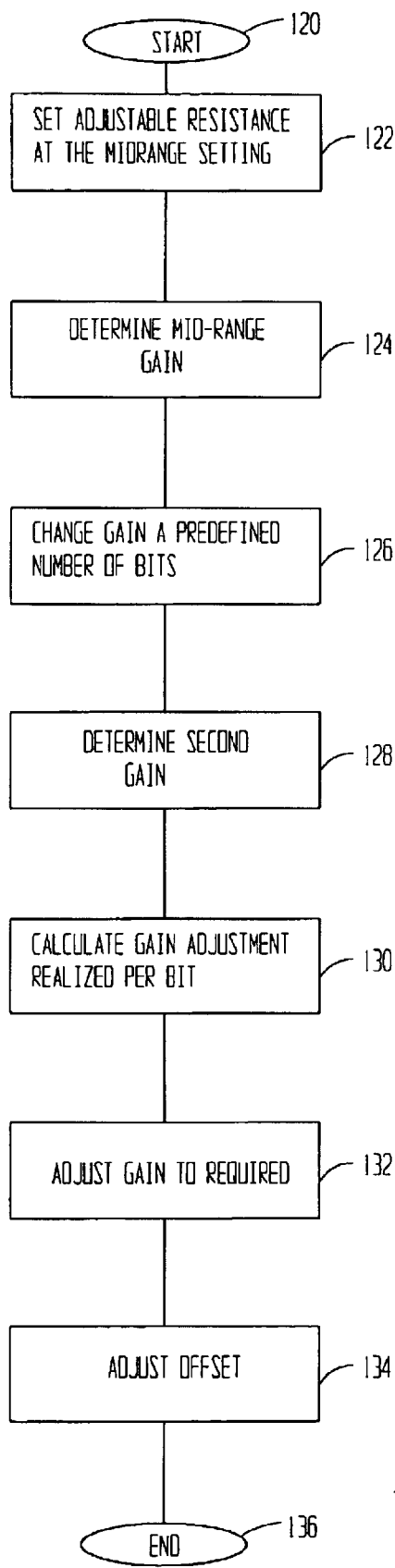
FIG. 8 shows a flow diagram of adjusting the gain and offset of a power supply unit of the preferred embodiments.

FIG. 8 shows a flow diagram for calibrating the load control circuit 64. The process starts at step 120 and proceeds to setting the adjustable resistance 112 at the midrange setting (step 122). If the adjustable resistance is merely a standard potentiometer, this may be done by a technician moving the wiper. In the preferred embodiments, however, setting the adjustable resistance 112 at the midrange involves electronically setting the potentiometer by way of the computer 116 (FIG. 7). Before moving on. It should be noted that while setting the adjustable resistor at the midrange is preferred for the initial step, the initial setting may be at any location, as it is the difference in gain realized for each step change in resistance of the digitally controlled resistance 112 that is of concern. Thus, the next step is the determination of the gain with the resistance set at midrange (step 124) (discussed more fully below). Next, the gain is changed a predefined number of bits—that is the resistance of the digitally controlled resistance 112 is changed a predefined number of bits (step 126). Thereafter, the gain of the overall circuit is determined based on the new setting of the digitally controlled resistance 112 (step 128). Knowing the difference between the gain realized between the two settings, the next step preferably involves calculated an amount of gain change realized for each bit-wise change in the digitally controlled resistance 112 setting (step 130). Once the gain per bit, or the gain responsiveness, is calculated, then preferably the computer system 116 adjusts the gain (adjusts the resistance of the digitally controlled resistance 112). Finally, after the gain is adjusted, the offset is adjusted by means of adjusting the digitally controlled resistance 108 in the offset circuit 82 (step 134). The process then ends (step 136). Adjusting the gain prior to adjusting the offset is important because the gain adjustment in the preferred circuit shown affects the offset, but not vice versa. Referring briefly to FIG. 6, it is seen that resistor R5 couples to signal 102 from the differential sense circuit 76. Likewise, resistor R13 couples to the output signal 106 of the offset circuit 82. Thus, the resistance of resistor R13 plays into the circuit that determines the gain. Determining the offset voltage is done on the input side of the op-amp 104, and thus the adjustment does not have an affect on the gain. However, one of ordinary skill could, now understanding operation of the circuits, devise equivalent circuits where the gain does not affect offset.

In the steps exemplified in FIG. 8, steps 124 and 128 recite determining a mid-range and second gain. Before proceeding, it must be understood that the determination of the mid-range gain is not finding a median of the possible gains, but instead is determining the gain realized with the digitally controlled resistance 112 set in its mid-position.

Figure 9:
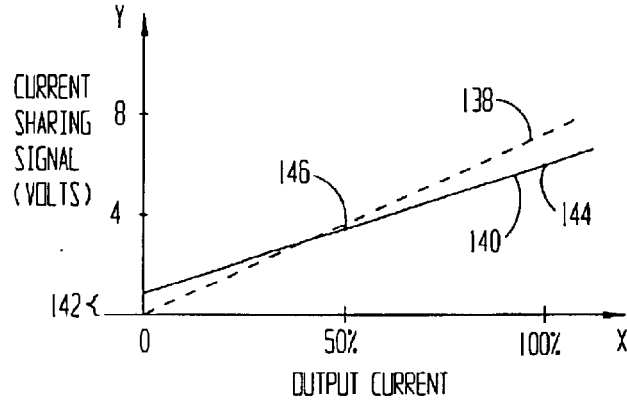
FIG. 9 shows an exemplary plot of output current versus the current sharing signal prior to gain and offset adjustment.

Referring now to FIG. 9, the determination of the gains will be described in more detail. FIG. 9 shows an exemplary graph of output current for a power supply unit versus current sharing signal. The dashed line 138 represents the ideal relationship between the output current (output power) and the current sharing signal according to the IPMI standard. Line 140, however, represents two possible problems. First, line 140 represents an incorrect gain (as indicated by the difference in slope between lines 140 and 138). Secondly, line 140 represents an unwanted offset 142 which manifests itself most clearly when the output current approaches zero.

The following description applies to the determination of a gain setting. The steps described are equally applicable to steps 124 and 128 of FIG. 8. In particular, the test load 118 is directed to require the maximum output current from the power supply unit 50. Based on the settings in the load control circuit 64, this produces a current sharing signal 84, as shown by point 144 of FIG. 9. The output current and current sharing signals are noted. Next, in the preferred embodiments, the test load 118 is set to require a 50% current draw capability of the power supply unit 50, and likewise this produces a current sharing signal 84, as shown by point 146. Here again, the output current and current sharing signal are noted. Using these two data points, the slope (or gain) of the circuit at a particular setting of resistance 112 may be calculated using the following equation:

$$\text{Gain} = \frac{Y_2 - Y_1}{X_2 - X_1} \quad (1)$$

where the X values are the output current values for the noted locations, and the Y values are the current sharing signal values for the noted locations.

Figure 10:
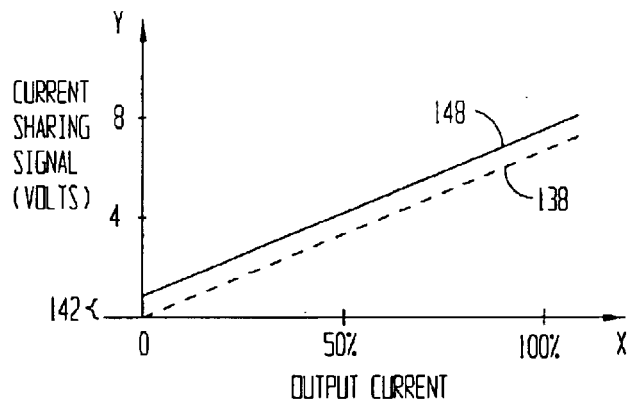
FIG. 10 shows an exemplary plot of output current versus current sharing signals after gain adjustment, but prior to offset adjustment.

Finally, referring to FIG. 10, there is shown an exemplary graph of an output of the load control circuit 64 as a function of the output current after the gain has been adjusted (note that the slope of line 148 is the same as the slope of line 138), but before adjusting the offset by change of resistance 108. After proper adjustment of the offset, the lines 148 and 138 would lie substantially on top of one another.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A power supply unit comprising:
   a power supply having a power output signal;
   a load control circuit coupled to the power output signal, wherein the load control circuit produces a load control signal operable to couple to other power supplies, the load control signal proportional to electrical current flow in the power output signal, the load control circuit further comprising
   an offset circuit operable to create an offset signal;
   a gain adjust circuit coupled to the offset circuit, the gain adjust circuit operable to offset the load control signal by an amount proportional to the offset signal.

2. A power supply unit comprising:
   a power supply having a power output signal;
   a resistor coupled in series with the power output signal;
   a diode coupled in series with the power output signal;
   a load control circuit coupled to the resistor, wherein the load control circuit produces a load control signal proportional to electrical current flow in the power output signal, the load control circuit further comprising
   a differential sense circuit coupled to the resistor and operable to create a differential sense signal proportional to the electrical current flow through the resistor;
   an offset circuit operable to create an offset signal, the offset circuit comprising
   an adjustable voltage divider circuit coupled on a first end to a power source, coupled on a second end to a power sink, and the voltage divider circuit creating a divider signal; and
   an operational amplifier configured as a voltage follower coupled on an input side to the divider signal, and wherein the output side of the operational amplifier produces the offset signal;
   a gain adjust circuit coupled to the differential sense circuit and the offset circuit, the gain adjust circuit operable to offset the differential sense signal by an amount proportional to the offset signal; and
   wherein the gain adjust circuit creates the load control signal based on the differential sense signal as offset by the offset signal.

3. The power supply unit as defined in claim 2 wherein the adjustable voltage divider circuit further comprises:
   a first and second resistor coupled in series between the power source and the power sink, the divider signal existing between the first and second resistor; and
   wherein the first resistor's resistance is selectively adjusted.

4. The power supply unit as defined in claim 3 wherein the first resistor is a part number DS1846 digitally controlled resistance device produced by Dallas Semiconductor.

5. The power supply unit as defined in claim 3 wherein the first resistor is a potentiometer.

6. A method comprising:
   sensing current flow of supplied power from a first power supply unit to create a sensed current flow;
   creating a current sharing signal based on the sensed current flow, wherein the current sharing signal couples to a second power supply; and
   correcting the current sharing signal for offset error by creating an offset signal proportional to the offset error and summing the current sharing signal with the offset signal to cancel the offset error.

7. A method comprising:
   sensing current flow of supplied power from a power supply unit to create a sensed current flow;
   creating a current sharing signal based on the sensed current flow; and correcting the current sharing signal for offset error comprising
   creating an offset signal proportional to the offset error; and
   summing the current sharing signal with the offset signal to cancel the offset error;
   wherein creating an offset signal proportional to the offset error comprises
   implementing an adjustable voltage divider circuit coupled on a first end to power source, and coupled on a second end to a power sink, the adjustable voltage divider circuit having a voltage divider output signal;

coupling the voltage divider output signal to an input of an operational amplifier configured as a voltage follower; and adjusting the adjustable voltage divider circuit.

8. The method as defined in claim 7 implementing an adjustable voltage divider circuit further comprises coupling at least one adjustable resistance device in the adjustable voltage divider circuit.

9. The method as defined in claim 8 wherein coupling at least one adjustable resistance device in the adjustable voltage divider circuit further comprises coupling a part number DS1846 digitally controlled resistive device produced by Dallas Semiconductor in the adjustable voltage divider circuit.

10. The method as defined in claim 8 wherein coupling at least one adjustable resistance device in the adjustable voltage divider circuit further comprises coupling a potentiometer in the adjustable voltage divider circuit.

11. In a system having multiple power supply units equalizing load based on a current sharing signal coupled between the power supply units, a method of creating the current sharing signal within a power supply unit comprising:

sensing current flow of supplied power from the power supply unit to create the current sharing signal coupled between the power supply units; and correcting the current sharing signal for offset errors by creating an offset signal proportional to the offset error and summing the current sharing signal with the offset signal to cancel the offset error.

12. The method as defined in claim 11 wherein sensing current flow of supplied power from the power supply unit to create the current sharing signal further comprises:

sensing a differential voltage created across a resistor in series with a supply current from the power supply unit; amplifying the differential voltage.

13. In a system having multiple power supply units equalizing load based on a current sharing signal coupled between the power supply units, a method of creating the current sharing signal within a power supply unit comprising:

sensing current flow of supplies power from the power supply unit to create the current sharing signal by sensing a differential voltage created across a resistor in series with a supply current from the power supply unit, and amplifying the differential voltage;

correcting the current sharing signal for offset errors by creating an offset signal proportional to the offset error of the current sharing signal by implementing an adjustable voltage divider circuit having a divider output signal, and wherein the divider output signal is the offset signal; and summing the offset signal with the current sharing signal.

14. The method as defined in claim 13 wherein implementing an adjustable voltage divider circuit further comprises:

coupling a first resistor and an adjustable resistor in series between a power source and ground; and coupling the divider output signal to an operational amplifier configured as a voltage follower.

15. A method of calibrating a current sharing signal of a power supply unit for parallel operation, the method comprising:

coupling a control computer to the power supply unit and a test load; end adjusting a current sharing signal of the power supply unit for offset errors by creating an offset signal proportional to the offset error, and summing the current sharing signal with the offset signal to cancel the offset error by the control computer, wherein the current sharing signal value is proportional to a power output of the power supply unit.

16. The method as defined in claim 15 wherein adjusting a current sharing signal of the power supply unit by the control computer further comprises:

determining a gain responsiveness of a gain adjust circuit; and adjusting a gain, by the computer, of the current sharing signal to match a desired output signal.

17. The method as defined in claim 15 wherein correcting offsets in the current sharing signal further comprises:

determining the offset of an internal current sharing signal;

creating an offset signal proportional to the offset; and summing the offset signal and the internal current sharing signal to create the current sharing signal.

18. The method as defined in claim 17 wherein adjusting a current sharing signal of the power supply unit by the control computer further comprises:

determining a gain responsiveness of a gain adjust circuit; and adjusting a gain, by the computer, of the current sharing signal to match a desired output signal.

19. A method of calibrating a current sharing signal of a power supply unit for parallel operation, the method comprising:

coupling the power supply unit to a control computer and a test load; and adjusting a current sharing signal of the power supply unit by the control computer by determining a gain responsiveness of a gain adjust circuit, and adjusting a gain of the current sharing signal to match a desired output signal;

wherein the current sharing signal value is proportional to a power output of the power supply unit; and wherein determining a gain responsiveness of a gain adjust circuit further comprises
setting the gain adjust circuit to a first gain setting; then
measuring a first gain of the gain adjust circuit; then
setting the gain adjust circuit to a second gain setting; then
measuring a second gain of the gain adjust circuit; and then
calculating the gain responsiveness based on the difference of the first and second gain settings and the measured first and second gains.

20. The method as defined in claim 19 wherein each of the measuring steps further comprises:

applying a first load to the power supply unit; and
recording a first recorded current sharing signal; then
applying a second load to the power supply unit; and
recording a second recorded current sharing signal; and
calculating a gain based on the first and second recorded current sharing signals and the first and second load.

21. The method as defined in claim 19 wherein the setting steps further comprise setting the load using the control computer.

22. A method of calibrating a current sharing signal of a power supply unit for parallel operation, the method comprising:

coupling the power supply unit to a control computer and a test load; and adjusting a current sharing signal of the power supply unit by the control computer by correcting an offset in the current sharing signal, wherein the current sharing signal value is proportional to a power output of the power supply unit;

wherein correcting the offset comprises
determining the offset of an internal current sharing signal;
creating an offset signal proportional to the offset by a resistance of a digitally controlled resistance device by the control computer; and
summing the offset signal and the internal current sharing signal to create the current sharing signal.

23. A method of calibrating a current sharing signal of a power supply unit for parallel operation, the method comprising:

coupling the power supply unit to a control computer and a test load; and adjusting a current sharing signal of the power supply unit by the control computer by correcting an offset in the current sharing signal, wherein the current sharing signal value is proportional to a power output of the power supply unit;

wherein adjusting the current sharing signal comprises
determining a pain responsiveness of a gain adjust circuit by
setting the gain adjust circuit to a first gain setting; then
measuring a first gain of the gain adjust circuit; then
setting the gain adjust circuit to a second gain setting; then
measuring a second gain of the gain adjust circuit; and then
calculating the gain responsiveness based on the difference of the first and second gain settings and the measured first and second gain; and
adjusting a gain, by the computer, of the current sharing signal to match a desired output signal.

24. The method as defined in claim 23 wherein each of the measuring steps further comprises:

applying a first load to the power supply unit; and
recording a first recorded current sharing signal; then
applying a second load to the power supply unit; and
recording a second recorded current sharing signal; and
calculating a gain based on the first and second recorded current sharing signals and the first and second load.

25. The method as defined in claim 24 wherein the setting steps further comprise setting the load using the control computer.

26. A power supply unit comprising:

a power supply creating a power output signal;
a means for generating a current sharing signal coupled to the power supply, wherein the current sharing signal couples to other power supply units and is proportional to an amount of power in the power output signal; and
wherein the means for generating adjusts the current sharing signal for offset errors.

27. The power supply unit as defined in claim 26 wherein the means for generating further comprises:

a means for creating a power sense signal proportional to the amount of power in the power output signal;
a means for creating an offset signal proportional to the offset errors;
a means for offsetting the power sense signal by an amount proportional to the offset signal, the means for offsetting coupled to each of the means for creating the power sense signal and the means for creating the offset signal; and
wherein the means for offsetting creates the current sharing signal based on the power sense signal as offset by the offset signal.

28. A power supply unit comprising:

a power supply creating a power output signal;
a means for generating a current sharing signal proportional to an amount of power in the power output signal, the means for generating coupled to the power supply;
wherein the means for generating adjusts the current sharing signal for offset errors, and further comprises
a means for creating a power sense signal proportional to the amount of power in the power output signal;
a means for creating an offset signal proportional to the offset errors;
a means for offsetting the power sense signal by an amount proportional to the offset signal, the means for offsetting coupled to each of the means for creating the power sense signal and the means for creating the offset signal; and
wherein the means for offsetting creates the current sharing signal based on the power sense signal as offset by the offset signal;
wherein the means for offsetting further comprises
an adjustable voltage divider circuit coupled on a first end to a power source, coupled on a second end to a power sink, and the voltage divider circuit creating a divider signal; and
an operational amplifier configured as a voltage follower coupled on an input side to the divider signal, and wherein the output side of the operational amplifier produces the offset signal.

29. The power supply unit as defined in claim 28 wherein the adjustable voltage divider circuit further comprises:

a first and second resistor coupled in series between a power source and a power sink, the divider signal existing between the first and second resistor; and
wherein the first resistor's resistance is selectively adjusted.

30. The power supply unit as defined in claim 29 wherein the first resistor is a part number DS1846 digitally controlled resistance device produced by Dallas Semiconductor.

31. The power supply unit as defined in claim 29 wherein the first resistor is a potentiometer.

* * * * *